United States Patent
Ohyama

(10) Patent No.: US 9,219,248 B2
(45) Date of Patent: Dec. 22, 2015

(54) ORGANIC ELECTROLUMINESCENCE DISPLAY DEVICE

(71) Applicant: Samsung Electronics Co., Ltd., Suwon-si (KR)

(72) Inventor: Tsuyoshi Ohyama, Kanagawa (JP)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 13/963,816

(22) Filed: Aug. 9, 2013

(65) Prior Publication Data

US 2014/0042409 A1 Feb. 13, 2014

(30) Foreign Application Priority Data

Aug. 10, 2012 (JP) ................................. 2012-178988
Jul. 18, 2013 (KR) ........................ 10-2013-0084938

(51) Int. Cl.

| H01J 5/16 | (2006.01) |
|---|---|
| H01J 61/40 | (2006.01) |
| H01K 1/26 | (2006.01) |
| H01K 1/30 | (2006.01) |
| H01L 51/52 | (2006.01) |
| H01L 27/32 | (2006.01) |

(52) U.S. Cl.
CPC ........ H01L 51/5262 (2013.01); H01L 51/5281 (2013.01); *H01L 27/3244* (2013.01); *H01L 2227/323* (2013.01)

(58) Field of Classification Search
USPC .......... 313/112, 113; 349/115, 96; 315/169.3
See application file for complete search history.

(56) References Cited

U.S. PATENT DOCUMENTS

| 7,067,985 B2 * | 6/2006 | Adachi ...................... 315/169.3 |
| 2004/0051445 A1 * | 3/2004 | Adachi ......................... 313/504 |

FOREIGN PATENT DOCUMENTS

| EP | 1677274 A1 * | 7/2006 | ............... G09F 9/00 |
| JP | 07-142170 | 6/1995 | |
| JP | 2001-357979 | 12/2001 | |
| JP | 2002-181239 | 6/2002 | |
| JP | 2002-215067 | 7/2002 | |
| JP | 2004-030955 | 1/2004 | |
| JP | 2007-227273 | 9/2007 | |
| JP | 2012-074221 | 4/2012 | |
| KR | 10-2009-0099248 | 9/2009 | |

* cited by examiner

*Primary Examiner* — Telly Green
(74) *Attorney, Agent, or Firm* — Cantor Colburn LLP

(57) ABSTRACT

An organic EL display device includes: a transparent substrate; a circularly-polarizing plate disposed on a first surface of the transparent substrate; a wiring layer disposed on a second surface of the transparent substrate; a selectively-reflecting layer disposed on the wiring layer, where the selectively-reflecting layer reflects only a circularly polarized component, which has a predetermined wavelength and rotates in a predetermined direction, in incident light, and the selectively-reflecting layer transmits light of a wavelength different from the predetermined wavelength in the incident light and a circularly polarized component, which has the predetermined wavelength and rotates in a direction different from the predetermined direction; a transparent electrode disposed on the selectively-reflecting layer; an emission layer disposed on the transparent electrode in a position corresponding to the selectively-reflecting layer, where the emission layer emits light of a predetermined color; and a reflective electrode disposed on the emission layer.

13 Claims, 16 Drawing Sheets

ORGANIC ELECTROLUMINESCENCE DISPLAY DEVICE

CROSS-REFERENCE TO RELATED APPLICATIONS

This application claims priority to Japanese Patent Application No. 2012-0178988, filed on Aug. 10, 2012, and Korean Patent Application No. 10-2013-0084938, filed on Jul. 18, 2013, and all the benefits accruing therefrom under 35 U.S.C. §119, the contents of which in their entireties are herein incorporated by reference.

BACKGROUND

1. Field

The disclosure relates to an organic electroluminescence ("EL") display device, and more particularly, to a bottom emission type organic EL display devices.

2. Description of the Related Art

An organic electroluminescence ("EL") display device typically includes an emission layer in each pixel thereof. The organic EL display device may adjust an amount of emitted light by adjusting an amount of current to be applied to the emission layer, and thus the organic EL display device typically has high energy efficiency. In the organic EL display device, reflected light (ghost light), which is derived from external light, may be emitted toward an observer through a display surface (refers to the outermost surface of the organic EL display device), such that the contrast and color reproducibility of the organic EL display device may be decreased.

SUMMARY

Embodiments disclosed herein relate to a bottom emission type organic electroluminescence ("EL") display device with improved brightness and contrast.

Additional features will be set forth in part in the description which follows and, in part, will be apparent from the description, or may be learned by practice of the presented embodiments.

According to an embodiment, an organic EL display device includes a transparent substrate; a circularly-polarizing plate disposed on a first surface of the transparent substrate; a wiring layer disposed on a second surface of the transparent substrate; a selectively-reflecting layer disposed on the wiring layer, where the selectively-reflecting layer reflects only a circularly polarized component, which has a predetermined wavelength and rotates in a predetermined direction, in incident light, and the selectively-reflecting layer transmits light of a wavelength different from the predetermined wavelength in the incident light and a circularly polarized component, which has the predetermined wavelength and rotates in a direction different from the predetermined direction; a transparent electrode disposed on the selectively-reflecting layer; an emission layer disposed on the transparent electrode in a position corresponding to the selectively-reflecting layer, where the emission layer emits light of a predetermined color; and a reflective electrode disposed on the emission layer.

In an embodiment, the circularly-polarizing plate may transmit the circularly polarized component which passes through the selectively-reflecting layer and rotates in the direction different from the predetermined direction. In such an embodiment, the circularly-polarizing plate may include a ¼ wave plate disposed on the first surface of the transparent substrate, and a polarizing plate disposed on the ¼ wave plate. In such an embodiment, the selectively-reflecting layer may include a cholesteric liquid crystal.

In an embodiment, the transparent electrode may be disposed in a position corresponding to the emission layer, and the reflective electrode may be a common electrode. In an embodiment, the wiring layer may include a protection layer, a first insulating layer, a second insulating layer and a third insulating layer, which are sequentially stacked on the second surface of the transparent substrate, and may further include a semiconductor layer disposed between the first insulating layer and the second insulating layer, a gate electrode disposed between the second insulating layer and the third insulating layer, a source electrode, and a drain electrode.

In an embodiment, a contact hole may be defined in the selectively-reflecting layer, and the transparent electrode and the drain electrode are connected to each other via the contact hole. In such an embodiment, the organic EL display device may further include a passivation layer disposed on a surface of the selectively-reflecting layer and on an inner surface of the contact hole. In such an embodiment, the wiring layer may further include a planarization layer disposed on the third insulating layer. In such an embodiment, the organic EL display device may further include an alignment layer disposed between the wiring layer and the selectively-reflecting layer. In such an embodiment, the emission layer may emit light of red, green or blue colors.

In an embodiment, the emission layer may emit white light. In such an embodiment, a color filter of a predetermined color may be disposed between the selectively-reflecting layer and the transparent electrode. In such an embodiment, a color filter of a predetermined color may be disposed between the transparent substrate and the selectively-reflecting layer.

According to another embodiment, an organic EL display device includes a transparent substrate; a circularly-polarizing plate disposed on a first surface of the transparent substrate; a wiring layer disposed on a second surface of the transparent substrate; a first selectively-reflecting layer disposed on the wiring layer, where the first selectively-reflecting layer reflects only a circularly polarized component, which has a predetermined wavelength and rotates in a predetermined direction, in incident light, and the first selectively-reflecting layer transmits light of a wavelength different from the predetermined wavelength in the incident light and a circularly polarized component, which has the predetermined wavelength and rotates in a direction different from the predetermined direction; a first transparent electrode disposed on the first selectively-reflecting layer; a first emission layer disposed on the first transparent electrode and emitting light of a predetermined primary color; a second transparent electrode disposed on one side of the first transparent electrode on the wiring layer; a second emission layer disposed on the second transparent electrode, where the second emission layer emits white light; and a reflective electrode disposed on the first and second emission layers.

In an embodiment, the organic EL display device may further include a plurality of second selectively-reflecting layers stacked between the wiring layer and the second transparent electrode, where the second selectively-reflecting layers reflects only circularly polarized components, which have the predetermined wavelength and rotate in the predetermined direction. In such an embodiment, the organic EL display device may further include an isotropic liquid crystal layer disposed between the wiring layer and the second transparent electrode.

BRIEF DESCRIPTION OF THE DRAWINGS

These and/or other features will become apparent and more readily appreciated from the following description of the embodiments, taken in conjunction with the accompanying drawings, in which.

DETAILED DESCRIPTION

Figure 1:
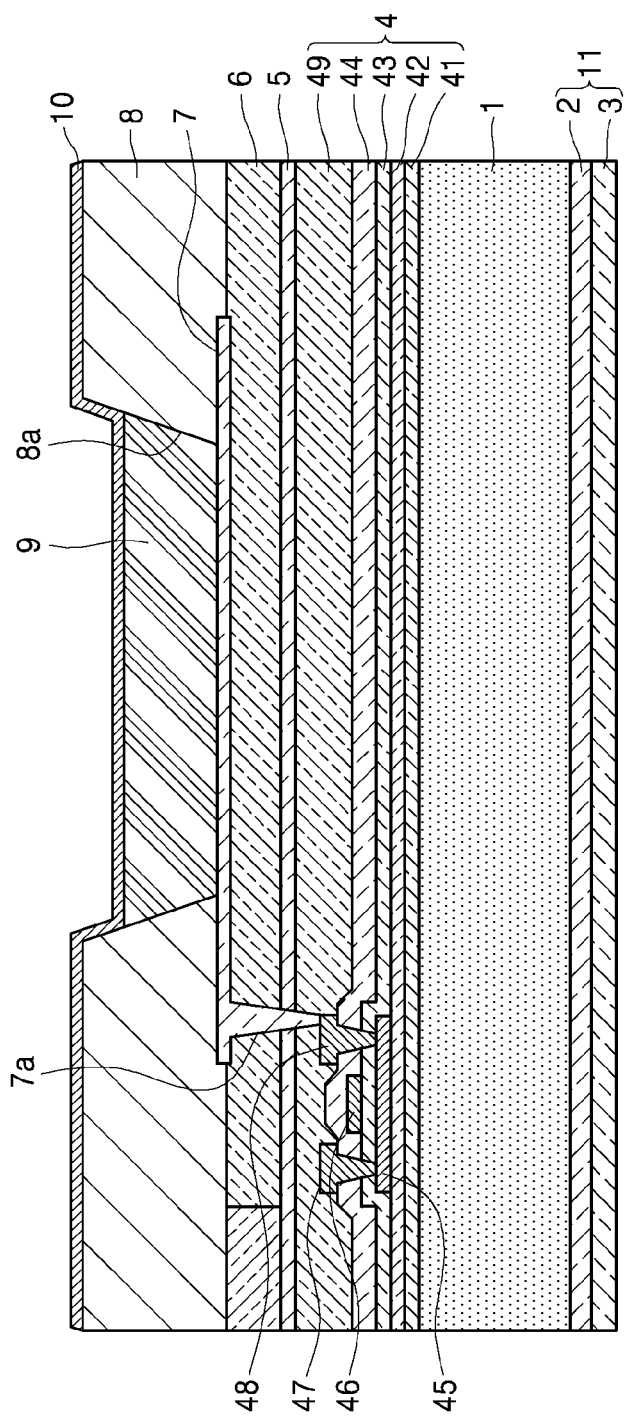
FIG. 1 is a cross-sectional view of an element of an embodiment of an organic electroluminescence ("EL") display device according to the invention.

The invention will be described more fully hereinafter with reference to the accompanying drawings, in which embodiments of the invention are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims set forth herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, embodiments of the invention will be described in further detail with reference to the accompanying drawings.

FIG. 1 is a cross-sectional view of an element of an embodiment of an organic electroluminescence ("EL") display device according to the invention. For convenience of description, FIG. 1 shows only a portion that emits any one primary color (for example, red, green or blue) in a plurality of colors constituting one pixel in the organic EL display device.

Referring to FIG. 1, the organic EL display device include a transparent substrate 1, and a ¼ wave plate 2 and a polarizing plate 3 are sequentially disposed on a first surface (a surface from which light is emitted, which is a lower surface of FIG. 1) of the transparent substrate 1. In one embodiment, for example, the transparent substrate may include a transparent material such as a glass, but not being limited thereto. The ¼ wave plate 2 and the polarizing plate 3 are collectively referred to as a circularly-polarizing plate 11. In such an embodiment, a thin film transistor ("TFT") layer 4, an alignment layer 5, a selectively-reflecting layer 6, a transparent electrode 7, a partition wall 8 and a reflective electrode 10 are sequentially disposed on a second surface (a top surface of FIG. 1) of the transparent substrate 1. The reflective electrode 10 may function as a common electrode. The reflective electrode 10 may include a metal layer having sufficient refractive index and film thickness to totally reflect light throughout a region of visible light to be incident.

The partition wall 8 may include an opaque insulating material. A through hole 8a that exposes the transparent electrode 7 is defined, e.g., formed, in the partition wall 8. An emission layer 9 that emits light of a predetermined primary color (for example, red, green or blue) is disposed in the through hole 8a. In an embodiment, the emission layer 9 may include an electron injection layer (not shown), an electron transport layer (not shown), an organic emission layer (not shown), a hole transport layer (not shown) and a hole injection layer (not shown), which are sequentially stacked on a transparent substrate 1. In an alternative embodiment, at least one of the electron injection layer, the electron transport layer, the hole transport layer and the hole injection layer may be omitted from the emission layer 9. The organic emission layer may further include a predetermined fluorescent material that generates light of a specific color.

The transparent electrode 7 has a portion that is in contact with an entire lower surface of the emission layer 9 and disposed between the selectively-reflecting layer 6 and the partition wall 8. The transparent electrode 7 may include, for example, indium tin oxide ("ITO"), but not being limited thereto. The selectively-reflecting layer 6 is disposed in a position corresponding to the emission layer 9 having a predetermined color. In an embodiment, the selectively-reflecting layer 6 is configured to reflect light having a wavelength of a predetermined color which is emitted by the emission layer 9. The selectively-reflecting layer 6 may include a cholesteric liquid crystal that selectively reflects a wavelength is filled (e.g., a liquid crystal having a cholesteric ring such as a halogen compound in which a hydroxyl group of cholesterol is substituted for halogen or an ester compound with fatty acid or carbonic acid). An operational principle of the cholesteric liquid crystal having a function for selectively reflecting a wavelength is well known, and thus a detailed description thereof will be omitted.

In the cholesteric liquid crystal, a liquid crystal molecule has a spiral shaped-structure, only circularly polarized components rotating in a direction that is the same as a torsional direction of the spiral-shaped structure of the liquid crystal molecule are reflected with respect to light having a wavelength $\lambda$ (nanometer: nm) that is objected by a relation of $\lambda=p\cdot n$ (here, p is a spiral pitch (nm) and n is an average refractive index of the liquid crystal), and circularly polarized components rotating in the direction opposite to the torsional direction of the spiral-shaped structure of the liquid crystal molecule and light having other wavelengths are transmitted. The spiral pitch of the liquid crystal molecule may be adjusted by adjusting a concentration of a chiral agent to be added to a liquid crystal material or by adjusting calories of light to be irradiated in a case of using a photoreactive chiral agent as a chiral agent. In this manner, the selectively-reflecting layer 6 may be configured to reflect only light having in a specific wavelength range, based on a wavelength $\lambda$ (nm) of light of a predetermined color which is generated by the corresponding emission layer 9. In one embodiment, for example, where an average refractive index (n) of a liquid crystal is 1, a torsional direction of the liquid crystal molecule is a right spiral direction. In another embodiment, where the spiral pitch is 550 nm, only a circularly polarized component in the right spiral direction of light having a specific wavelength range based on about 550 nm is reflected. In such an embodiment, a rotation direction of the circularly polarized light having a wavelength $\lambda$ (nm) which is transmitted by the selectively-reflecting layer 6 is consistent with a rotation direction of circularly polarized light that is transmitted by the circularly-polarizing plate 11 described above.

The alignment layer 5 is a layer for aligning the arrangement of the liquid crystal molecules. In one embodiment, for example, the alignment layer 5 may include polyimide, but not being limited thereto. A contact hole 7a is defined, e.g., formed, in the alignment layer 5 and the selectively-reflecting layer 6 to penetrate the alignment layer 5 and the selectively-reflecting layer 6. In such an embodiment, the transparent electrode 7 and a drain electrode 48 of a TFT in the TFT layer 4 are connected to each other through the contact hole 7a. The TFT layer 4 that functions as a wiring layer includes a protection layer 41, a first insulating layer 42, a second insulating layer 43, a third insulating layer 44 and a planarization layer 49, which are sequentially stacked on the transparent substrate 1. The TFT layer 4 further includes a semiconductor layer 45 disposed between the first insulating layer 42 and the second insulating layer 43, a gate electrode 46 disposed between the second insulating layer 43 and the third insulating layer 44, a source electrode 47, and a drain electrode 48. The semiconductor layer 45 is disposed between the first insulating layer 42 and the second insulating layer 43 and does not overlap the emission layer 9. The gate electrode 45 is disposed between the second insulating layer 43 and the third insulating layer 44 in a position corresponding to the center of the semiconductor layer 42 with the second insulating layer 43 interposed therebetween, and the gate electrode 45 may include a metal. The source electrode 47 extends to penetrate the second insulating layer 43 and the third insulating layer 44 and to be electrically connected to one end of the semiconductor layer 42, and the source electrode 47 may include a metal. The drain electrode 48 extends to penetrate the second insulating layer 43 and the third insulating layer 44, to be electrically connected to other end of the semiconductor layer 42, and to be electrically connected to the transparent electrode 7 through the contact hole 7a, and the drain electrode 48 may include a metal. The semiconductor layer 45, the gate electrode 46, the source electrode 47 and the drain electrode 48 are collectively referred to as a "TFT." Although not shown in the drawing, a plurality of wiring lines including a metal and electrically connected to the gate electrode 46 or the source electrode 47 are provided in the TFT layer 4.

Figure 2:
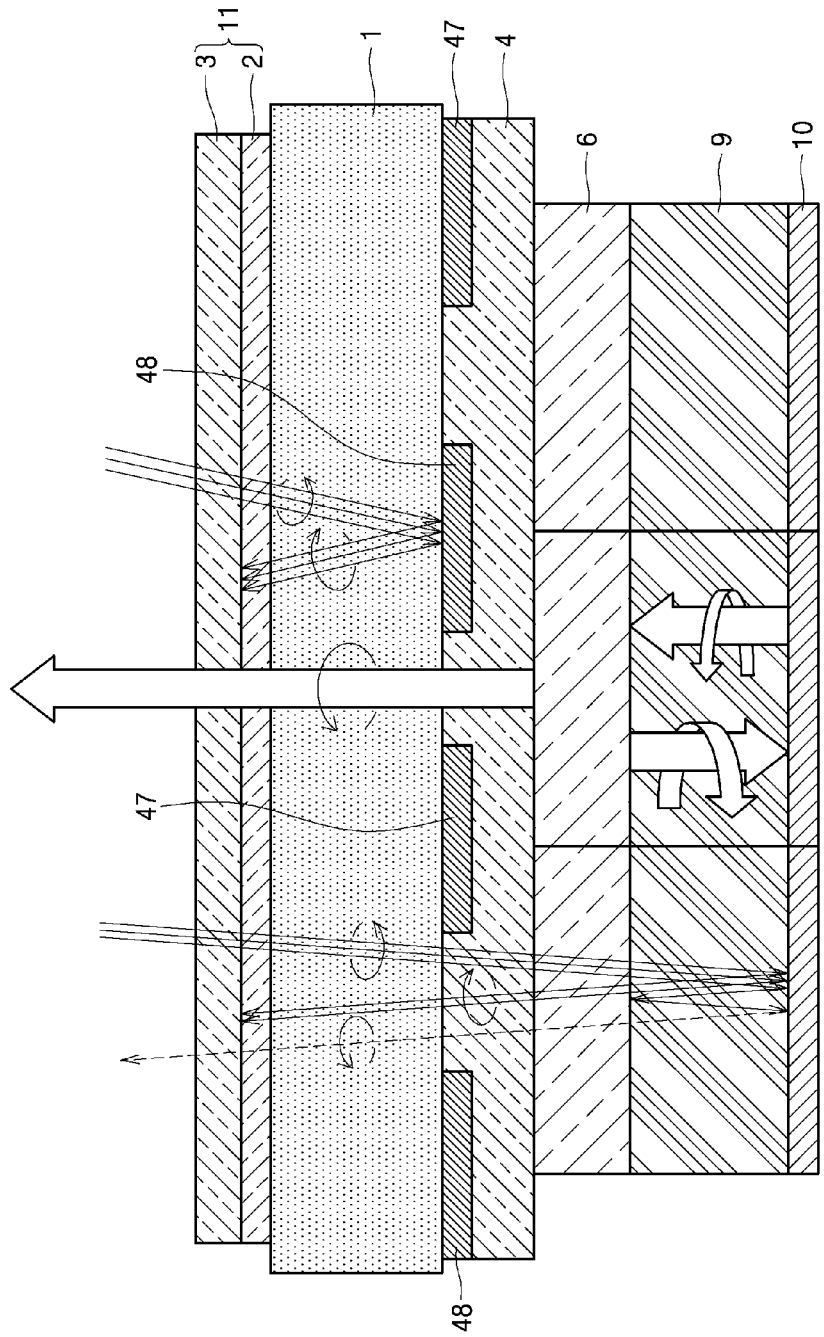
FIG. 2 is a diagram illustrating an operation of the organic EL display device shown in FIG. 1.

FIG. 2 is a diagram illustrating an operation of the organic EL display device shown in FIG. 1.

Operations of the organic EL display device of FIG. 1 will be described with reference to FIG. 2 (turned upside down in a direction opposite to FIG. 1).

Referring to FIGS. 1 and 2, when a predetermined voltage is applied to the gate electrode 46 of the TFT corresponding to the emission layer 9, the TFT is turned on, and thus holes are injected into the hole injection layer of the emission layer 9 through the source electrode 47, the semiconductor layer 45, the drain electrode 48 and the transparent electrode 7, and electrons are injected into the electron injection layer of the emission layer 9 through the reflective electrode 10. Thus, the fluorescent material in the organic emission layer of the emission layer 9 is excited, thereby emitting light having a wavelength $\lambda$ (nm) of a predetermined color in all directions.

Components of each light flux constituting the light of the predetermined color, which is emitted from the emission layer 9 as described above, may be a combination of a circularly polarized component rotating in a right spiral direction and a circularly polarized component rotating in a left spiral direction. Thus, the light of the predetermined color may be divided into two circularly polarized light beams by the selectively-reflecting layer 6. That is, in the light that generated from the emission layer 9 and is directly incident on the selectively-reflecting layer 6 or in the light that is reflected by the reflective electrode 10 and is then incident on the selectively-reflecting layer 6, a circularly polarized component in a direction the same as a transmission direction of the circularly-polarizing plate 11, directly passes through the selectively-reflecting layer 6, but a circularly polarized component rotating in a direction opposite to the transmission direction of the circularly-polarizing plate 11 is reflected within the selectively-reflecting layer 6. In one embodiment, for example, where a direction of the spiral structure of the liquid crystal molecule of the selectively-reflecting layer 6 is a right spiral direction, a rotation direction of the circularly polarized light which passes by the circularly-polarizing plate 11 may be a left spiral direction as shown in FIG. 2, the circularly polarized component rotating in the left spiral direction passes through the selectively-reflecting layer 6, and the circularly polarized component rotating in the right spiral direction is reflected within the selectively-reflecting layer 6. The circularly polarized component reflected within the selectively-reflecting layer 6 is incident again within the emission layer 9 and then reflected by the reflective electrode 10. Then, the circularly polarized component is incident again on the selectively-reflecting layer 6 in a state where the rotation direction thereof is reversed (e.g., in a state the circularly polarized component is reversed in the left spiral direction as shown in FIG. 2), and then passes through the selectively-reflecting layer 6.

As described above, in such an embodiment, all components of light generated from the emission layer 9 pass through the selectively-reflecting layer 6 in a state where the all components are converted into circularly polarized light in the same rotation direction as the circularly polarized light passing by the circularly-polarizing plate 11, and then pass through the TFT layer 4, the transparent substrate 1 and the circularly-polarizing plate 11 to be emitted to the outside. Accordingly, in such an embodiment, brightness of a display through a display device is effectively prevented from being decreased.

In such an embodiment, when external light is incident on the organic EL display device, about one half of components of the external light is absorbed by the polarizing plate 3 when passing through the polarizing plate 3 of the circularly-polarizing plate 11, and the other half of the components pass through the ¼ wave plate 2 to be converted into circularly polarized light (e.g., the circularly polarized light rotating in the left spiral direction as shown in FIG. 2). Then, when the external light is incident on the gate, source or drain electrode 46, 47 or 48 included in the TFT layer 4 or a surface of a wiring line (not shown) through the transparent substrate 1, the external light is reflected by the electrode 46, 47 or 48 or the surface of the wiring line, and the rotation direction thereof is reversed after the reflection (e.g., the rotation direction thereof is reversed in the right spiral direction as shown in FIG. 2). Accordingly, when the reflected light passes through the transparent substrate 1 again and then incident on the circularly-polarizing plate 11, the rotation direction thereof is opposite to the rotation direction (e.g., the left spiral direction as shown in FIG. 2) of the circularly polarized light passing through the circularly-polarizing plate 11, and thus all components of the reflected light are absorbed by the polarizing plate 3 and are not emitted to the outside.

In such an embodiment, in external light passing through the circularly-polarizing plate 11 and the transparent substrate 1, external light passing through a transparent portion in the TFT layer 4 is incident on the selectively-reflecting layer 6, but both a light beam having the wavelength $\lambda$ (nm), which is not reflected by the selectively-reflecting layer 6, and a light beam having the wavelength $\lambda$ (nm), which is reflected by the selectively-reflecting layer 6, are converted into the circularly polarized light rotating in a direction (e.g., the left spiral direction as shown in FIG. 2) in which the circularly polarized light passes through the selectively-reflecting layer 6, and thus both the light beams pass through the selectively-reflecting layer 6 toward the emission layer 9. Accordingly, all wavelength components of the external light are incident on the selectively-reflecting layer 6 again since the rotation direction of the circularly polarized light thereof is reversed (e.g., reversed in the right spiral direction as shown in FIG. 2).

In the reflected light that is incident on the selectively-reflecting layer 6 again, a light beam having the wavelength $\lambda$ (nm), which is not reflected by the selectively-reflecting layer 6, passes through the selectively-reflecting layer 6, the TFT layer 4 and the transparent substrate 1 toward the circularly-polarizing plate 11 again, such that the rotation direction of the circularly polarized light thereof is opposite to the rotation direction (e.g., the left spiral direction as shown in FIG. 2) of the circularly polarized light in which the circularly-polarizing plate 11 passes, and thus the light beam is absorbed by the polarizing plate 3 and is not emitted to the outside.

In addition, in the reflected light that is incident on the selectively-reflecting layer 6 again, a rotation direction of a light beam having the wavelength $\lambda$ (nm), which is reflected by the selectively-reflecting layer 6, is consistent with a torsional direction (e.g., the right spiral direction as shown in FIG. 2) of the spiral structure of the liquid crystal molecule. Thus, the light beam is reflected by the selectively-reflecting layer 6, then incident within the emission layer 9 again, and then is reflected by the reflective electrode 10 again such that the rotation direction of the circularly polarized light of the light beam is reversed again (e.g., reversed in the left spiral direction again as shown in FIG. 2) to be incident on the selectively-reflecting layer 6 again. In this case, the rotation direction of the circularly polarized light of the light beam that is incident on the selectively-reflecting layer 6 again is opposite (e.g., the left spiral direction as shown in FIG. 2) to the torsional direction of the spiral structure of the liquid crystal molecule, and thus the light beam passes through the selectively-reflecting layer 6, the TFT layer 4, and the transparent substrate 1 to be incident on the circularly-polarizing plate 11. In this case, the rotation direction of the circularly polarized light thereof is the same as the rotation direction (e.g., the left spiral direction as shown in FIG. 2) of the circularly polarized light in which the circularly-polarizing plate 11 passes, and thus the light beam passes through the circularly-polarizing plate 11, and then emitted to the outside. In an embodiment, where the organic EL display device is a bottom emission type organic EL display device, a ratio of an entire area occupied by the transparent portion (that is, a portion in which each electrode of the TFT or the wiring line is not provided) in the TFT layer 4 is low, and a ratio of an entire area corresponding to the partition wall 8, which is occupied by the emission layer 9, is lower than the ratio of the area occupied by the transparent portion. Thus, in such an embodiment, an amount of reflected light derived from external light that passes through the circularly-polarizing plate 11 and then emitted to the outside is substantially small such that a negative influence of the reflected light derived from external light on the contrast is substantially reduced or minimized.

As described above, in an embodiment of the organic EL display device, the TFT for driving the transparent electrode 7 that applies a current to the emission layer 9, and the wiring line are provided between the transparent substrate 1 and the selectively-reflecting layer 6 on one side of the transparent substrate 1 such that reflected light of external light, which enters the organic EL display device from the outside and then reflected by the electrodes of the TFT or the surface of the wiring line, may not pass through the selectively-reflecting layer 6. A rotation direction of circularly polarized light of the reflected light of the external light, which is reflected by the electrodes or the surface of the wiring line, is reversed, and thus the reflected light is absorbed by the circularly-polarizing plate and is not emitted to the outside. Therefore, in such an embodiment, a decrease in contrast may be effectively prevented or substantially minimized while maintaining the brightness of a display.

Hereinafter, an embodiment of a process of manufacturing the embodiment of an organic EL display device shown in FIG. 1 will be described. FIGS. 3 to 6 illustrate an embodiment of a process of manufacturing the organic EL display device shown in FIG. 1.

Figure 3:
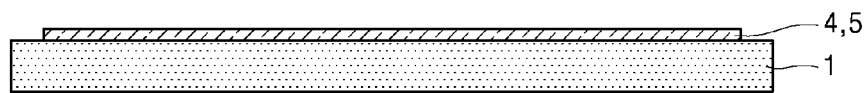
FIGS. 3 to 6 are diagrams illustrating an embodiment of a process of manufacturing the organic EL display device shown in FIG. 1.
Figure 4:
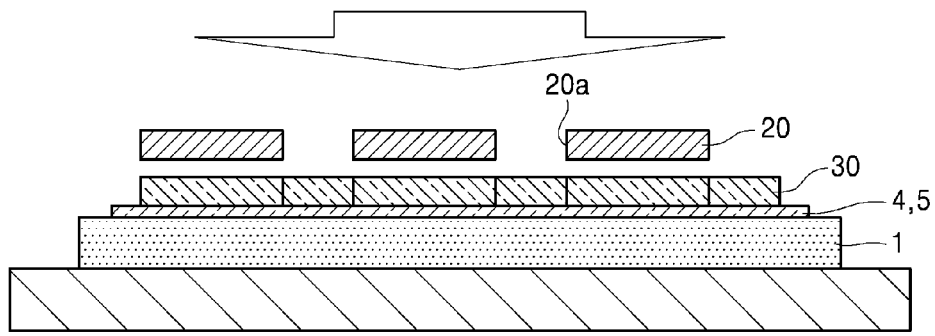

Referring to FIG. 3, the TFT layer 4 and the alignment layer 5 are sequentially provided, e.g., formed, on a first surface (e.g., the top surface as shown in FIG. 3) of the transparent substrate 1. Subsequently, referring to FIG. 4, a cholesteric liquid crystal composition 30 is applied onto the alignment layer 5. In an embodiment, a concentration of a photoreactive chiral agent in the cholesteric liquid crystal composition 30 is adjusted such that a spiral pitch of a liquid crystal molecule in the cholesteric liquid crystal composition 30 is fixed to a width for reflecting light of a predetermined color, for example, light of a red region, at room temperature. Subsequently, a mask 20 having light translucent portions 20a defined therein are provided, disposed, on the liquid crystal composition 30. In an embodiment, the light translucent portions 20a are disposed to correspond to a position a pixel that emits red light. Then, a liquid crystal composition is irradiated with ultraviolet ("UV") rays through the light translucent portions 20a at room temperature. In such an embodiment, although not shown in FIG. 3, a pattern (e.g., a light blocking portion) for forming the contact hole 7a is also defined in the light translucent portion 20a of the mask 20. Thus, the selectively-reflecting layer 6 for red light is provided.

Figure 5:
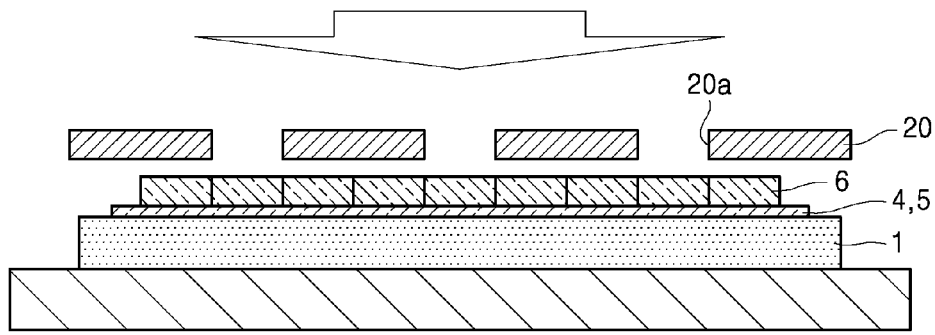
Figure 6:
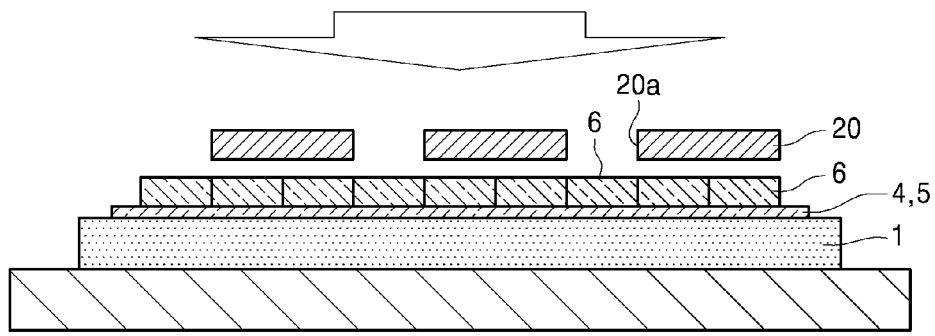

Next, referring to FIG. 5, the mask 20 is moved and the light translucent portions 20a are thereby disposed to correspond to a pixel that emits green light. Subsequently, the liquid crystal composition 30 is irradiated with UV rays through the light translucent portions 20a while heating the liquid crystal composition 30 up to a temperature at which the cholesteric liquid crystal reflects a green color. As a result, the selectively-reflecting layer 6 for green light is provided. Then, referring to FIG. 6, the mask 20 is moved, and the light translucent portions 20a are disposed to correspond to a position of a pixel that emits blue light. Subsequently, the liquid crystal composition 30 is irradiated with UV rays through the light translucent portions 20a while heating the liquid crystal composition 30 up to a temperature at which the cholesteric liquid crystal reflects a blue color. As a result, the selectively-reflecting layer 6 for blue light is provided. Thereafter, the transparent electrode 7, the partition wall 8, the emission layer 9 and the reflective electrode 10 are sequentially provided e.g., formed, on the selectively-reflecting layer 6. Then, the ¼ wave plate 2 and the polarizing plate 3 are sequentially provided, e.g., formed, on a second surface of the transparent substrate 1.

Figure 7:
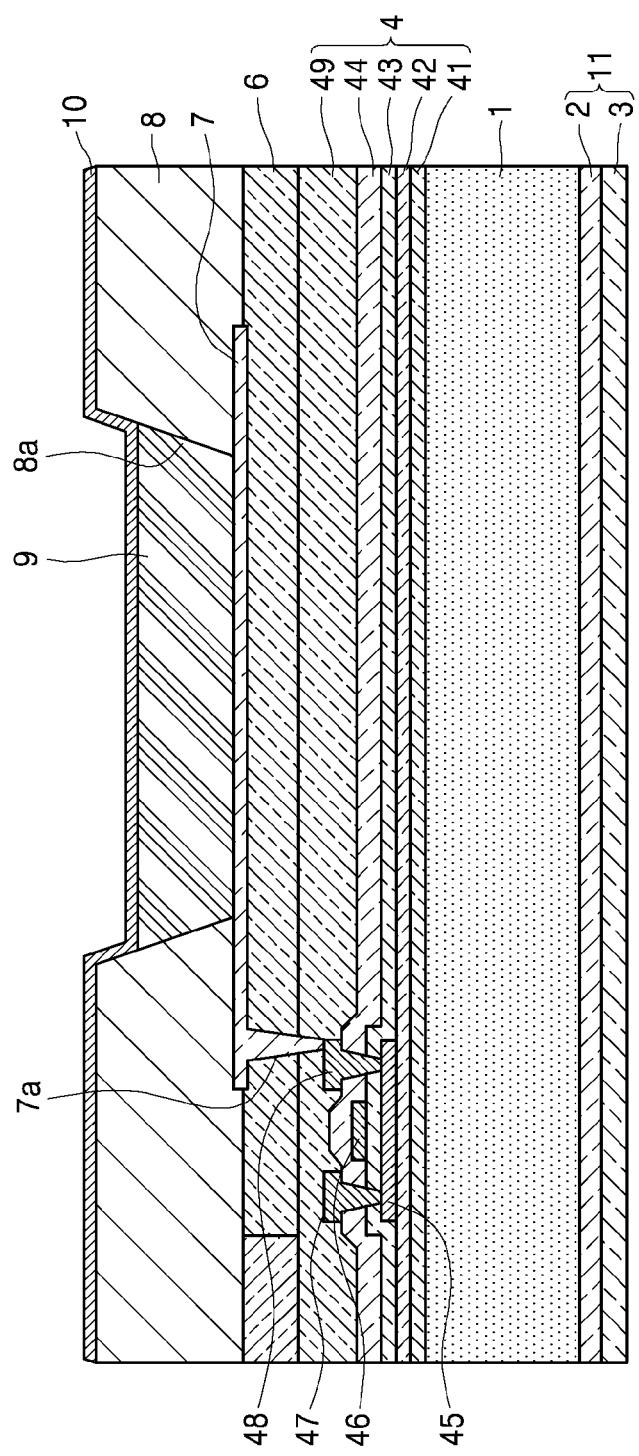
FIG. 7 is a cross-sectional view of an element of another embodiment of an organic EL display device according to the invention.

FIG. 7 is a cross-sectional view of another embodiment of an element of an organic EL display device according to the invention.

The organic EL display device in FIG. 7 is substantially the same as the organic EL display device in FIG. 1 except for the alignment layer 5. The same or like elements shown in FIG. 7 have been labeled with the same reference characters as used above to describe the embodiments of the organic EL display device in FIG. 1, and any repetitive detailed description thereof will hereinafter be omitted or simplified.

Referring to FIG. 7, in an embodiment, the alignment layer 5 is not provided in the organic EL display device. The alignment layer 5 of the organic EL display device shown in FIG. 1 is provided to align the arrangement of liquid crystal molecules during the manufacture of liquid crystals. However, the alignment layer 5 may be omitted because the alignment layer 5 does not operate after a process of providing the selectively-reflecting layer 6. In such an embodiment, an alignment process for aligning directivity may be omitted by using a cholesteric liquid crystal material having an improved orientation such that a thickness of the organic EL display device may be reduced and manufacturing process thereof may be simplified. Therefore, operations and a manufacturing process of the organic EL display device shown in FIG. 7 are substantially the same as operations and a manufacturing process of the embodiment of the organic EL display device shown in FIG. 1 except for the features related to the alignment layer 5.

Figure 8:
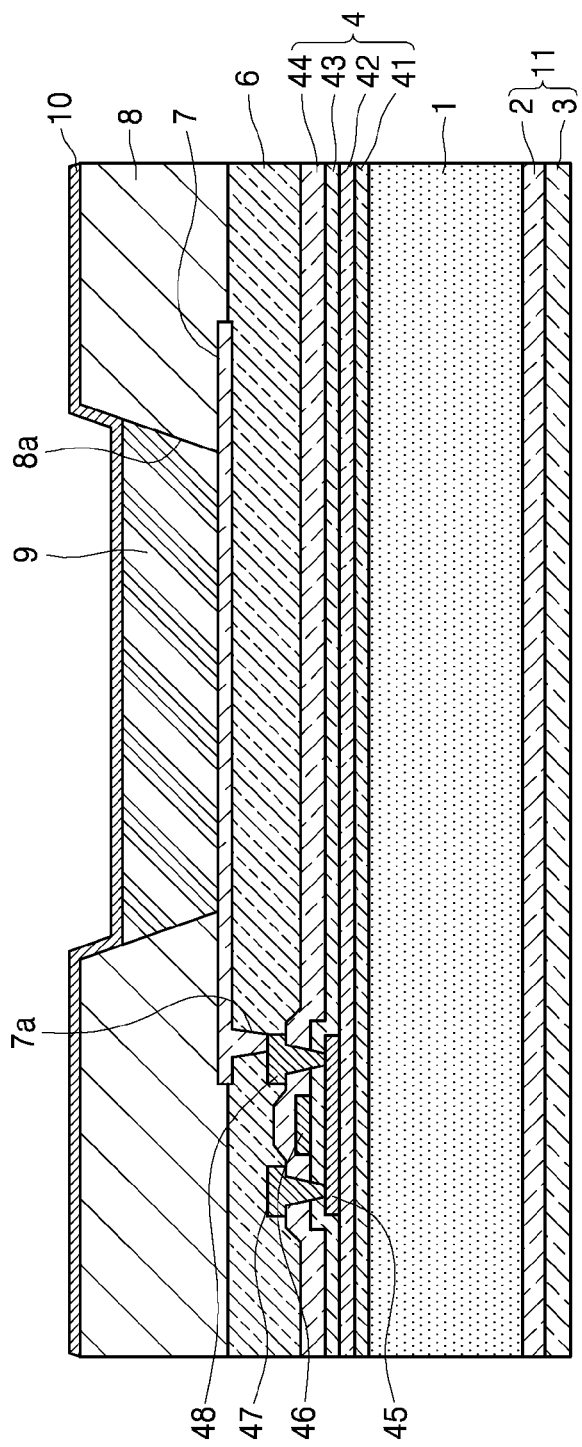
FIG. 8 is a cross-sectional view of an element of another embodiment of an organic EL display device according to the invention.

FIG. 8 is a cross-sectional view of an element of another embodiment of an organic EL display device according to the invention.

The organic EL display device in FIG. 8 is substantially the same as the organic EL display device in FIG. 7 except for the planarization layer 49. The same or like elements shown in FIG. 7 have been labeled with the same reference characters as used above to describe the embodiments of the organic EL display device in FIG. 7, and any repetitive detailed description thereof will hereinafter be omitted or simplified.

Referring to FIG. 8, in an embodiment, the planarization layer 49 may be omitted and the selectively-reflecting layer 6 functions as the planarization layer 49. In an embodiment, the planarization layer 49 (see FIGS. 1 and 7) may be provided to planarize a surface on which the transparent electrode 7 is provided. In another embodiment, as shown in FIG. 8, the planarization layer 49 may be omitted because the planarization layer 49 does not function after a process of providing the transparent electrode 7. In such an embodiment, a cholesteric liquid crystal layer may provide a planarized plane for the transparent electrode 7. Therefore, operations and a manufacturing process of the organic EL display device shown in FIG. 8 are substantially the same as operations and a manufacturing process of the embodiment of the organic EL display device shown in FIG. 7 except for the features related to the planarization layer 49.

Figure 9:
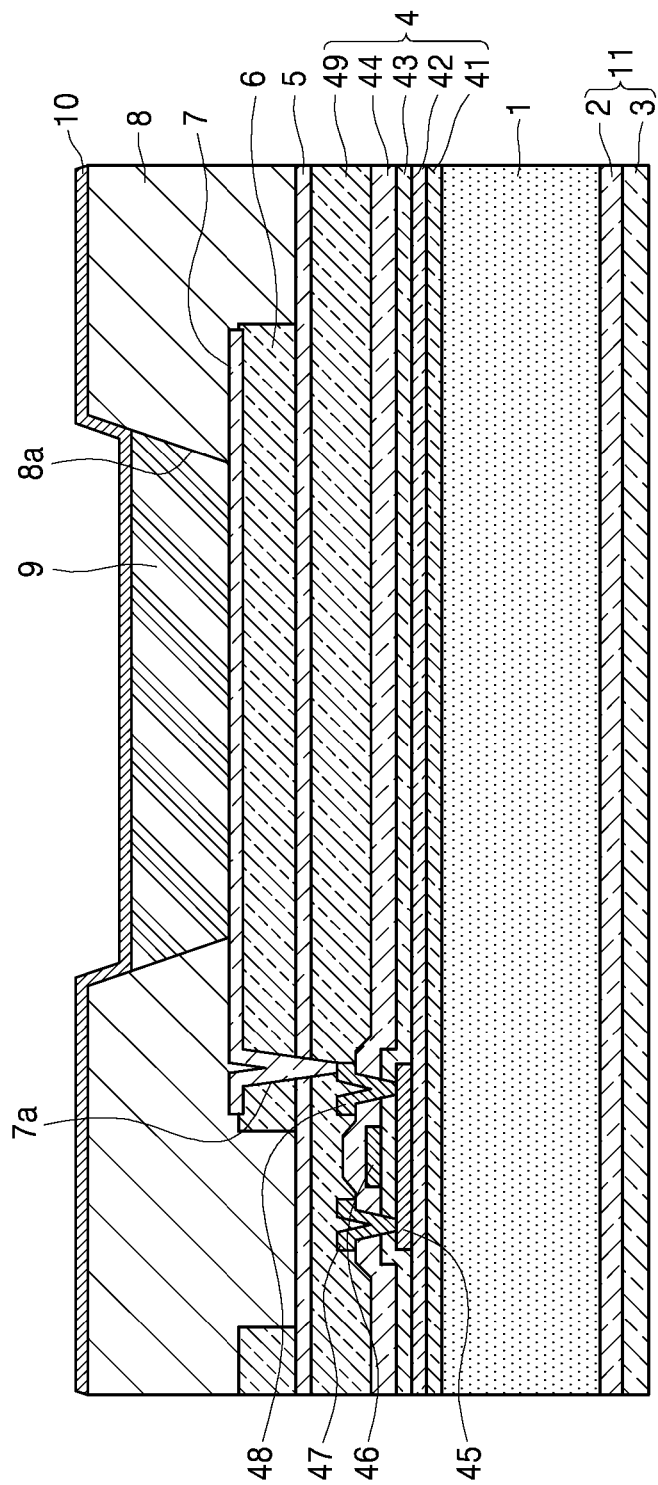
FIG. 9 is a cross-sectional view of an element of another embodiment of an organic EL display device according to the invention.

FIG. 9 is a cross-sectional view of an element of another embodiment of an organic EL display device according to the invention.

The organic EL display device in FIG. 9 is substantially the same as the organic EL display device in FIG. 1 except for the selectively-reflecting layer 6. The same or like elements shown in FIG. 1 have been labeled with the same reference characters as used above to describe the embodiments of the organic EL display device in FIG. 1, and any repetitive detailed description thereof will hereinafter be omitted or simplified.

Referring to FIG. 9, in an embodiment, the selectively-reflecting layer 6 may be divided into portions for red, green and blue light, which are separated or spaced apart from each other. In an embodiment, the selectively-reflecting layer 6 is an optical layer such that the selectively-reflecting layer 6 may be divided into a plurality of disconnected portions. Operations of the organic EL display device shown in FIG. 9 are substantially the same as operations of the embodiment of the organic EL display device shown in FIG. 1.

Hereinafter, an embodiment of a process of manufacturing the organic EL display device shown in FIG. 9 will be described. FIGS. 10 to 21 illustrate an embodiment of a process of manufacturing the organic EL display device shown in FIG. 9.

Figure 10:
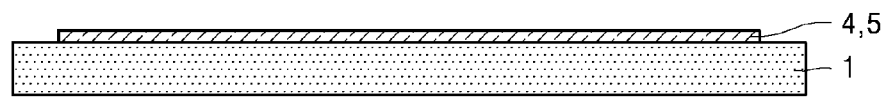
FIGS. 10 to 21 are diagrams illustrating an embodiment of a process of manufacturing the organic EL display device shown in FIG. 9.
Figure 11:
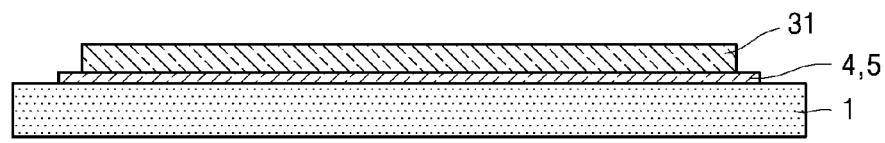
Figure 12:
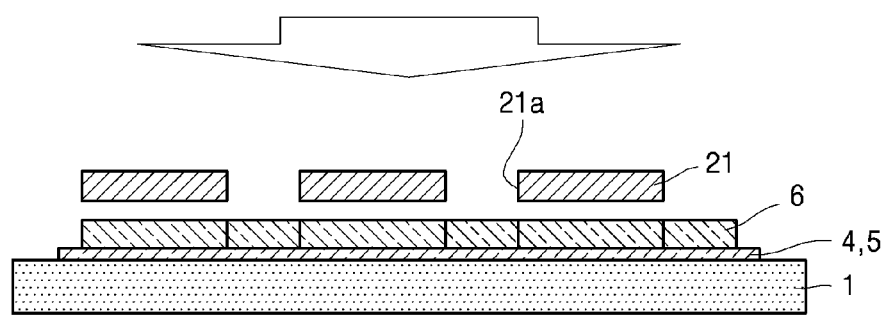
Figure 13:
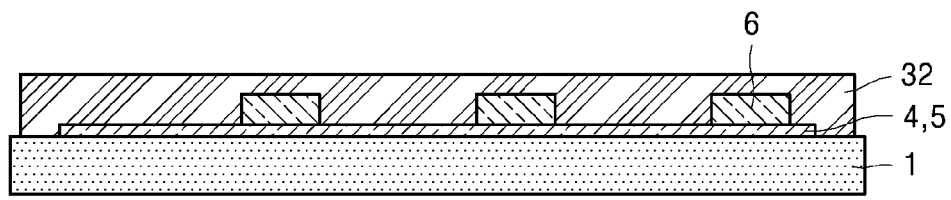
Figure 14:
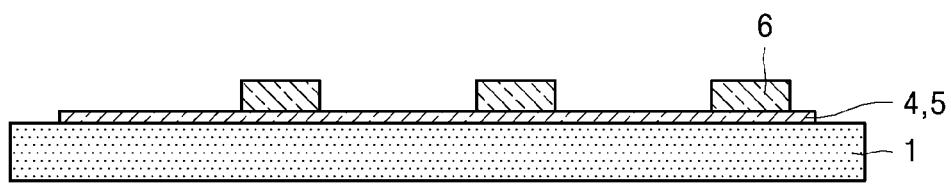

Referring to FIG. 10, the TFT layer 4 and the alignment layer 5 are sequentially provided, e.g., formed, on a first surface (e.g., the top surface as shown in FIG. 10) of the transparent substrate 1. Referring to FIG. 11, a cholesteric liquid crystal composition 31 is applied onto the alignment layer 5. In such an embodiment, a concentration of a photo-reactive chiral agent in the cholesteric liquid crystal composition 31 is adjusted such that a spiral pitch of a liquid crystal molecule is fixed to a width for reflecting, for example, light of a red region, at room temperature. Referring to FIG. 12, a mask 21 having light translucent portions 21*a* defined therein are provided, e.g., disposed, on the liquid crystal composition 31. In such an embodiment, the light translucent portions 21*a* are disposed to correspond to a position of a pixel that emits red light. Then, the liquid crystal composition 31 is irradiated with UV rays through the light translucent portions 21*a* at room temperature. In such an embodiment, although not shown in the drawing, a pattern (a light blocking portion) for forming the contact hole 7*a* is also defined in the light translucent portion 21*a* of the mask 21. Thus, the selectively-reflecting layer 6 for red light is hardened. Referring to FIG. 13, the liquid crystal composition 31 is developed using a developing solution 32, and thus a portion of the liquid crystal composition 31, which is not yet hardened, is removed. As a result, as shown in FIG. 14, only the hardened selectively-reflecting layer 6 for red light remains on the alignment layer 5.

Figure 15:
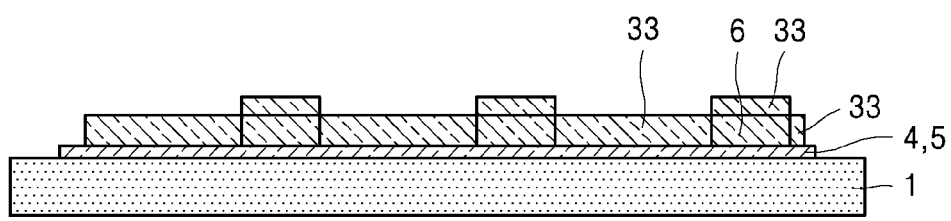
Figure 16:
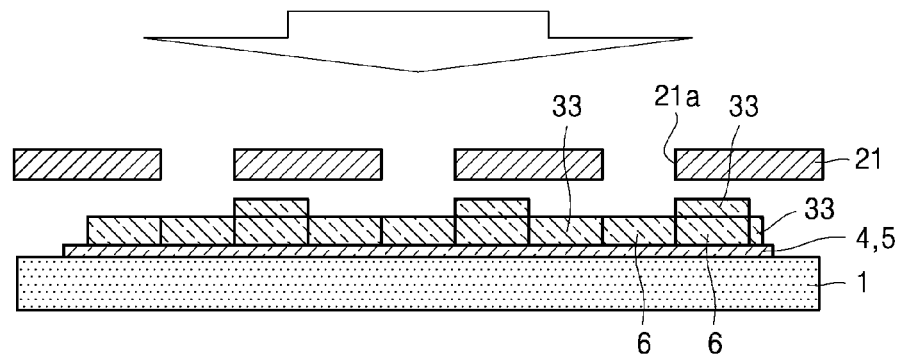
Figure 17:
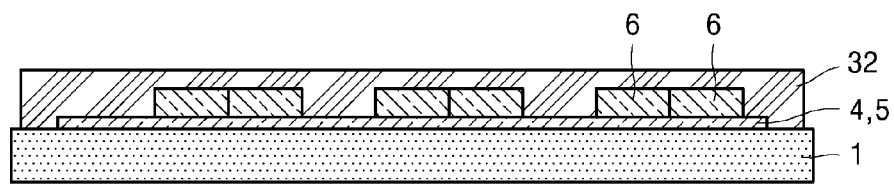
Figure 18:
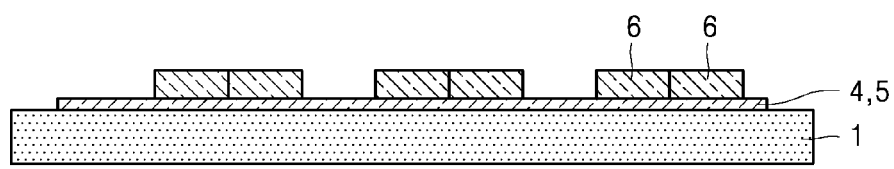

Referring to FIG. 15, a photopolymerizable cholesteric liquid crystal composition 33 is applied onto the alignment layer 5. In such an embodiment, a concentration of a chiral agent in the photopolymerizable cholesteric liquid crystal composition 33 is adjusted such that a spiral pitch of a liquid crystal molecule is fixed to a width for reflecting light of a green region at room temperature. Referring to FIG. 16, the mask 21 having light translucent portions 21*a* defined therein are provided on the liquid crystal composition 33. In such an embodiment, the light translucent portions 21*a* are disposed to correspond to a position of a pixel that emits green light. Then, the liquid crystal composition 33 is irradiated with UV rays through the light translucent portions 21*a*. Thus, the selectively-reflecting layer 6 for green light is hardened. As shown in FIG. 17, the liquid crystal composition 33 is developed using the developing solution 32, and thus a portion of the liquid crystal composition 33, which is not yet hardened, is removed. As a result, as shown in FIG. 18, only the hardened selectively-reflecting layer 6 for red light and the selectively-reflecting layer 6 for green light remain on the alignment layer 5.

Figure 19:
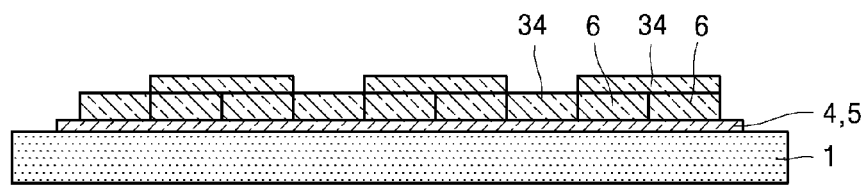
Figure 20:
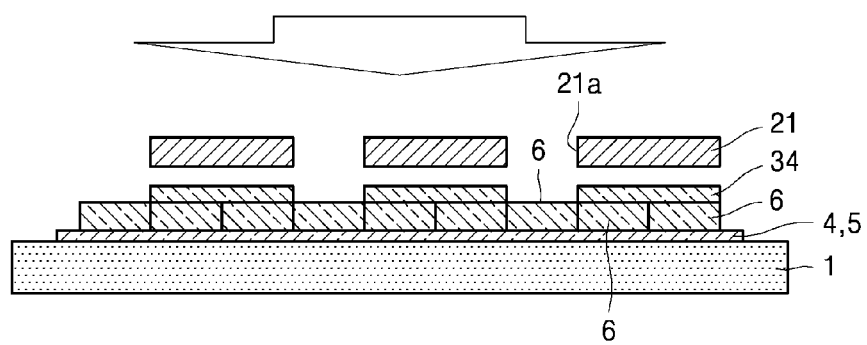
Figure 21:
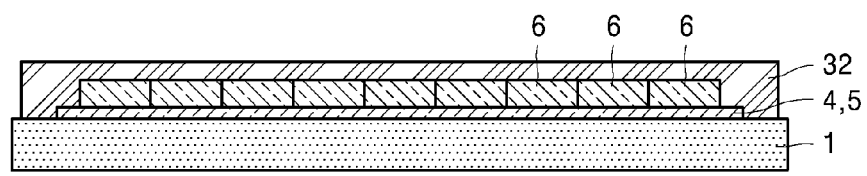

Referring to FIG. 19, a photopolymerizable cholesteric composition 34 is applied onto the alignment layer 5. In such an embodiment, a concentration of a chiral agent in the photopolymerizable cholesteric composition 34 is adjusted such that a spiral pitch of a liquid crystal molecule is fixed to a width for reflecting light of a blue region at room temperature. Referring to FIG. 20, the mask 21 having light translucent portions 21*a* defined therein are provided on the liquid crystal composition 34. In such an embodiment, the light translucent portions 21*a* are disposed to correspond to a position emitting red light of a pixel. Then, the liquid crystal composition 34 is irradiated with UV rays through the light translucent portions 21*a*. Thus, the selectively-reflecting layer 6 for blue light is hardened. Referring to FIG. 21, the liquid crystal composition 34 is developed using the developing solution 32, and thus a portion of the liquid crystal composition 34, which is not yet hardened, is removed. As a result, only the selectively-reflecting layer 6 for red light, the selectively-reflecting layer 6 for green light, and the selectively-reflecting layer 6 for blue light remain on the alignment layer 5. Thereafter, the transparent electrode 7, the partition wall 8, the emission layer 9 and the reflective electrode 10 are sequentially provided, e.g., formed, on the selectively-reflecting layer 6. Then, the ¼ wave plate 2 and the polarizing plate 3 are sequentially provided, e.g., formed, on the second surface of the transparent substrate 1.

Figure 22:
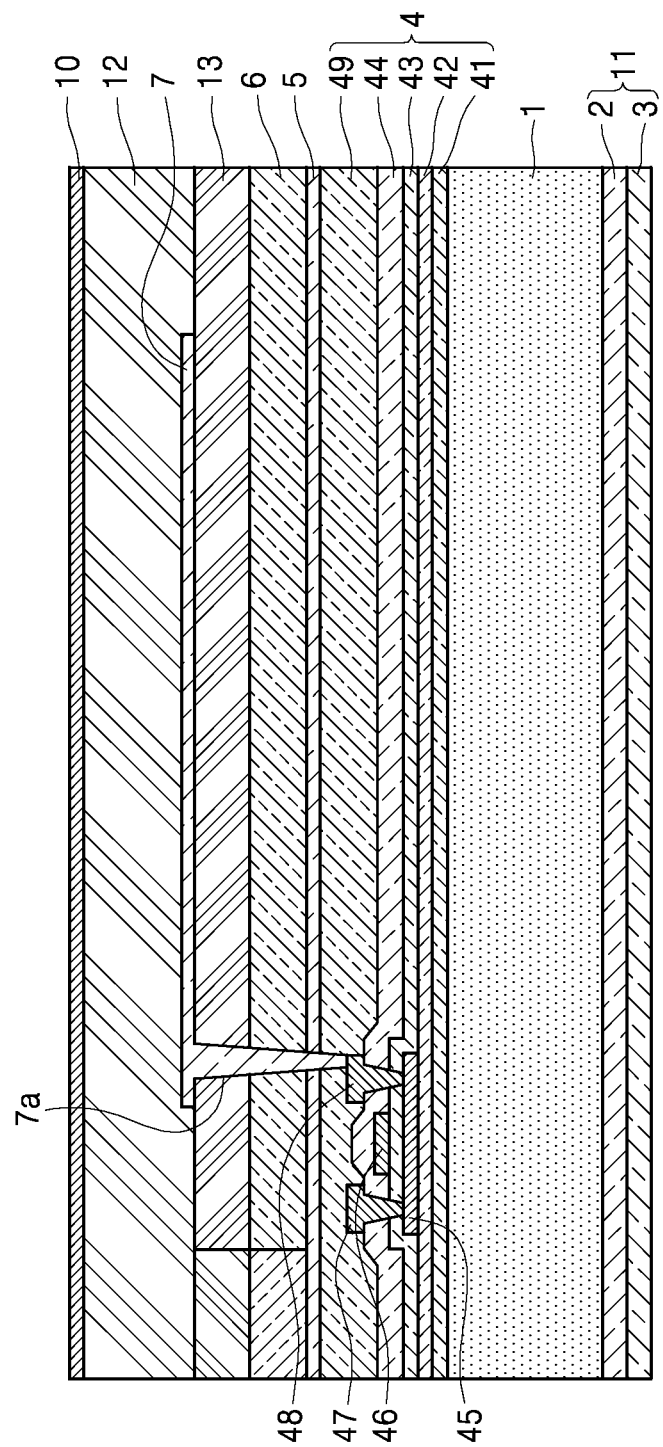
FIG. 22 is a cross-sectional view of an element of another embodiment of an organic EL display device.

FIG. 22 is a cross-sectional view of an element of another embodiment of an organic EL display device according to the invention.

The organic EL display device in FIG. 22 is substantially the same as the organic EL display device in FIG. 1 except for the partition wall 8 and the emission layer 9. The same or like elements shown in FIG. 22 have been labeled with the same reference characters as used above to describe the embodiments of the organic EL display device in FIG. 1, and any repetitive detailed description thereof will hereinafter be omitted or simplified.

Referring to FIG. 22, an embodiment of the organic EL display device includes a white emission layer 12 for emitting white light and a color filter 13 for transmitting only a wavelength component of any one color disposed between the selectively-reflecting layer 6 and the transparent electrode 7 to correspond to the transparent electrode 7 (that is, a position corresponding to a portion emitting light by a current applied by the transparent electrode 7 in the white emission layer 12). In such a configuration, in white light generated from the white emission layer 12, only a light beam of a specific color (for example, red, green, or blue) passes through the color filter 13, and thus, in such an embodiment of the organic EL display device, only a light beam having the corresponding wavelength is incident on the selectively-reflecting layer 6. Accordingly, operations of the organic EL display device shown in FIG. 22 are substantially the same as the operations of the embodiment of the organic EL display device shown in FIG. 1 except that in the external light incident within the organic EL display device, a wavelength component that is not reflected by the selectively-reflecting layer 6 is absorbed by the color filter 13.

Figure 23:
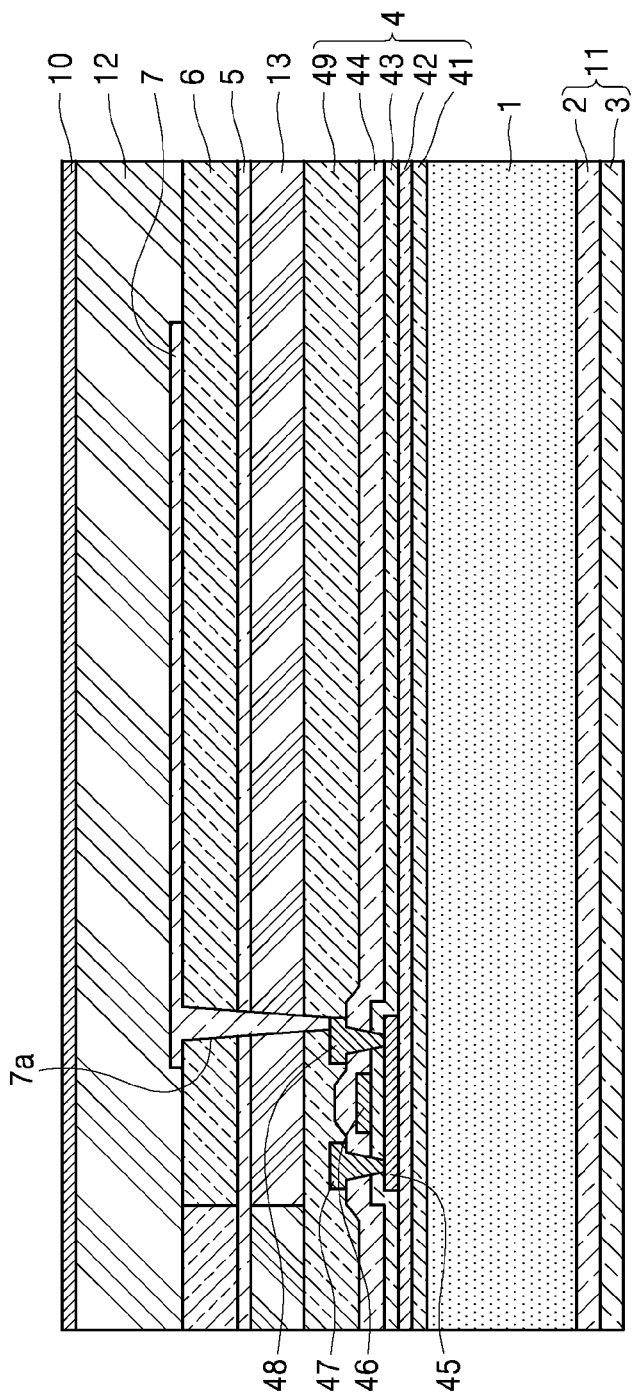
FIG. 23 is a cross-sectional view of an element of another embodiment of an organic EL display device according to the invention.

FIG. 23 is a cross-sectional view of an element of another embodiment of an organic EL display device according to the invention.

The organic EL display device in FIG. 23 is substantially the same as the organic EL display device in FIG. 22 except for the color filter 13. The same or like elements shown in FIG. 23 have been labeled with the same reference characters as used above to describe the embodiments of the organic EL display device in FIG. 22, and any repetitive detailed description thereof will hereinafter be omitted or simplified.

Referring to FIG. 23, an embodiment of the organic EL display device includes the color filter 13 disposed between the planarization layer 49 and the alignment layer 5. In such an embodiment, the operations of the organic EL display device are the same as the operations of the embodiment of the organic EL display device shown in FIG. 22 except that in the external light incident within the organic EL display device, a wavelength component that is not reflected by the selectively-reflecting layer 6 is absorbed by the color filter 13 before being incident on the selectively-reflecting layer 6 since an order of passing through the selectively-reflecting layer 6 is opposite to an order of passing through the color filter 13.

Figure 24:
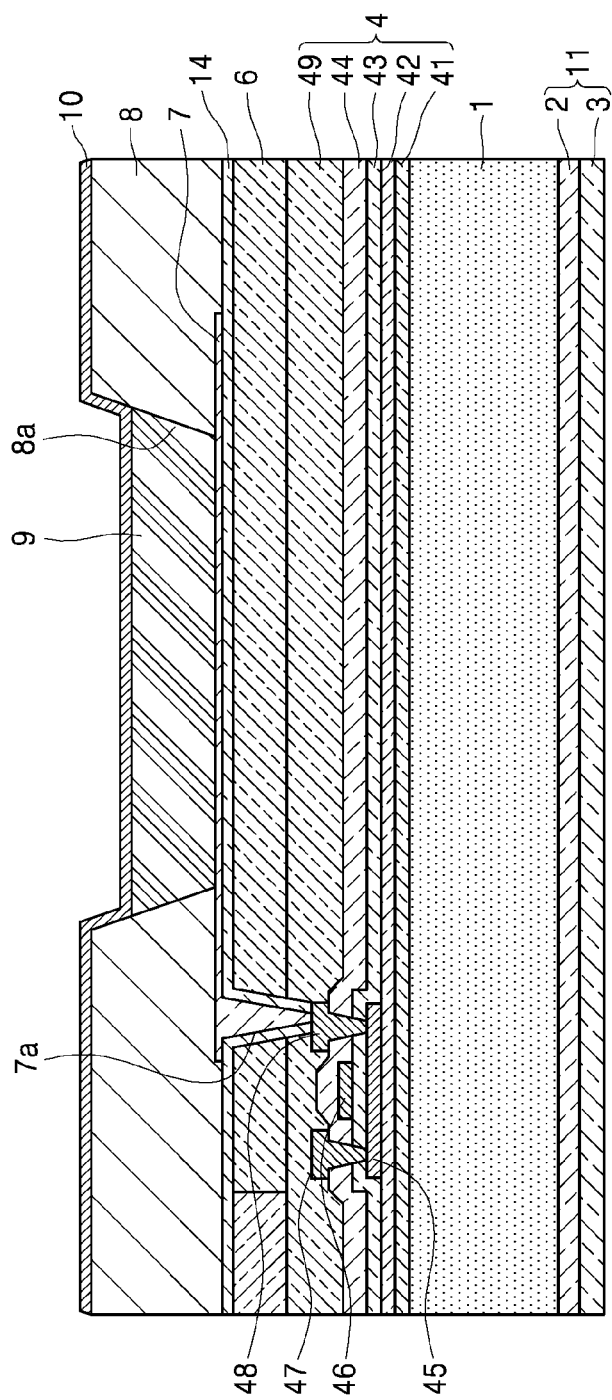
FIG. 24 is a cross-sectional view of an element of another embodiment of an organic EL display device according to the invention.

FIG. 24 is a cross-sectional view of an element of another embodiment of an organic EL display device according to the invention.

The organic EL display device in FIG. 24 is substantially the same as the organic EL display device in FIG. 1 except for the alignment layer 5. The same or like elements shown in FIG. 24 have been labeled with the same reference characters as used above to describe the embodiments of the organic EL display device in FIG. 1, and any repetitive detailed description thereof will hereinafter be omitted or simplified.

Referring to FIG. 24, an embodiment of the organic EL display device does not include the alignment layer 5 but includes a passivation layer 14 including silicon nitride (SiN) disposed on the surface of the selectively-reflecting layer 6 and within the contact hole 7a. In such an embodiment, other configurations are substantially the same as the embodiment of the organic EL display shown in FIG. 1, and the operations of the organic EL display device is also substantially the same as the embodiment of the organic EL display device shown in FIG. 1.

Figure 25:
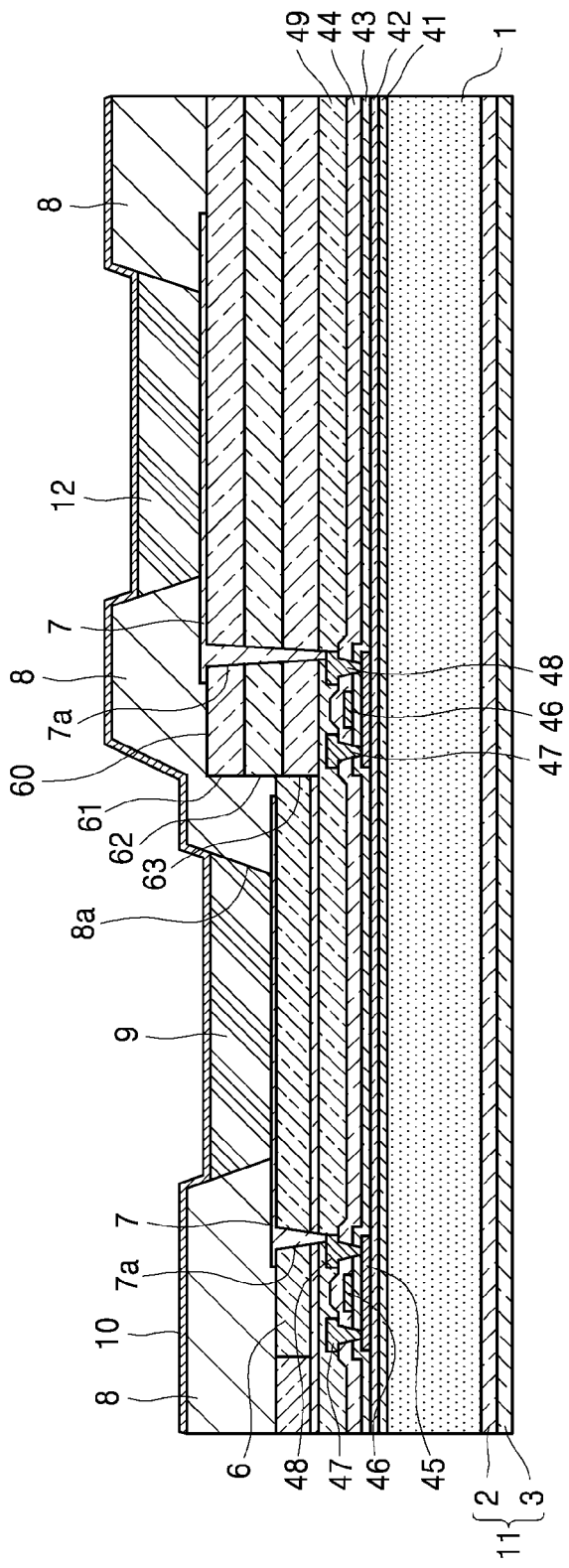
FIG. 25 is a cross-sectional view of an element of another embodiment of an organic EL display device according to the invention.

FIG. 25 is a cross-sectional view of an element of another embodiment of an organic EL display device according to the invention. FIG. 25 shows a portion that emits light of any one primary color (for example, red, green or blue) and a portion that emits light of a white color of a plurality of colors constituting one pixel in the organic EL display device. In such an embodiment of the organic EL display device shown in FIG. 25, one pixel includes four emission layers for emitting light of three primary colors (for example, red, green, and blue) and a white color, and thus color reproducibility of the white color is substantially improved.

Referring to FIG. 25, in an embodiment, the portions for emitting light of primary colors have substantially the same configuration as the portions for emitting light of primary colors in the embodiment shown in FIG. 1. In such an embodiment, the portions for emitting light of a white color are provided with the white emission layer 12 that emits light of a white color instead of the emission layer 9 for emitting light of a primary color and are provided with a reflection layer 60 including three selectively-reflecting layers 61, 62 and 63, each reflecting only light beams (e.g., circularly polarized component in a predetermined rotation direction) having wavelength bands of primary colors (e.g., red, green and blue) instead of the selectively-reflecting layer 6 for a single color.

In such an embodiment of the organic EL display device shown in FIG. 25, the operations of the portions for emitting light of primary colors are substantially the same as the operations of the portions for emitting light of primary colors in the embodiment shown in FIG. 1. In such an embodiment, the operations regarding the reflection of the external light in the electrodes 46 to 48 of the TFT and in the wiring line in the portion for emitting white light are substantially the same as the operations regarding the reflection of the external light in the electrodes 46 to 48 of the TFT and in the wiring line in the embodiment shown in FIG. 1.

In such an embodiment, the primary colors (e.g., red, green and blue) constituting the white light generated from the white emission layer 12 are divided into circularly polarized components, which rotate in the same rotation direction (e.g., the left spiral direction as shown in FIG. 2) as circularly polarized light that passes through the circularly-polarizing plate 11 in any one of the selectively-reflecting layers 61, 62 and 63 which corresponds to the wavelength band thereof, and circularly polarized components rotating in a direction opposite to the circularly polarized light. The circularly polarized components rotating in the same direction as the circularly polarized light that passes through the circularly-polarizing plate 11 pass through the reflection layer 60, and the circularly polarized components rotating in a direction opposite to the circularly polarized light are reflected within the selectively-reflecting layers 61, 62 and 63, and then returned to the white emission layer 12. In such an embodiment, as described above, the circularly polarized components of the primary colors (e.g., red, green and blue) returned to the white emission layer 12 are reflected by the reflective electrode 10, and thus the rotation directions thereof are reversed. Accordingly, the circularly polarized components are incident on the reflection layer 60 again, but the circularly polarized components then pass through the selectively-reflecting layers 61, 62 and 63 to be emitted from the reflection layer 60. As a result, all the components emitted from the reflection layer 60 are included in circularly polarized light that rotates in the same direction (e.g., the left spiral direction as shown in FIG. 2) as the circularly polarized light that passes through the circularly-polarizing plate 11. Accordingly, in such an embodiment, all the components generated from the white emission layer 12 pass through the circularly-polarizing plate 11 and are emitted to the outside, and the brightness of a display is thereby substantially maintained.

In such an embodiment, external light passing through the circularly-polarizing plate 11 to enter the organic EL display device is constituted by only circularly polarized components rotating in a predetermined direction (e.g., the left spiral direction as shown in FIG. 2), such that the external light passes through the reflection layer 60 to enter the white emission layer 12. The external light entering the white emission layer 12 is reflected by the reflective electrode 10, and thus the rotation direction thereof is reversed. Accordingly, the external light, which is incident on the reflection layer 60 again, is reflected by the selectively-reflecting layers 61, 62 and 63 corresponding to the respective wavelength components, and then returned to the white emission layer 12. In such an embodiment, as described above, the external light returned to the white emission layer 12 is reflected by the reflective electrode 10, and thus the rotation direction thereof is reversed again. Accordingly, the external light is incident on the reflection layer 60 again, and then passes through the selectively-reflecting layers 61, 62 and 63 to be emitted from the reflection layer 60. As a result, the external light passes through the circularly-polarizing plate 11 and is emitted to the outside. In an embodiment, where the organic EL display device is the bottom emission type organic EL display device, a ratio of an area occupied by an entire of the transparent portion (e.g., a portion in which each electrode of the TFT or the wiring line is not provided) in the TFT layer 4 is low, and a ratio of an area of an entire of the partition wall 8, which is also occupied by the emission layer 9, is lower than the ratio of the area occupied by the entire of the transparent portion. Thus, in such an embodiment, an amount of reflected light derived from external light that passes through the circularly-polarizing plate 11 and is emitted to the outside is substantially small, such that the degree of a negative influence of the reflected light derived from external light on the contrast is substantially reduced or effectively minimized.

In an embodiment of the organic EL display device, as shown in FIG. 25, the portions for emitting light of primary colors may have substantially the same configuration as the portions for emitting light of primary colors in the embodiments shown in FIGS. 8, 9 and 22 to 24.

Figure 26:
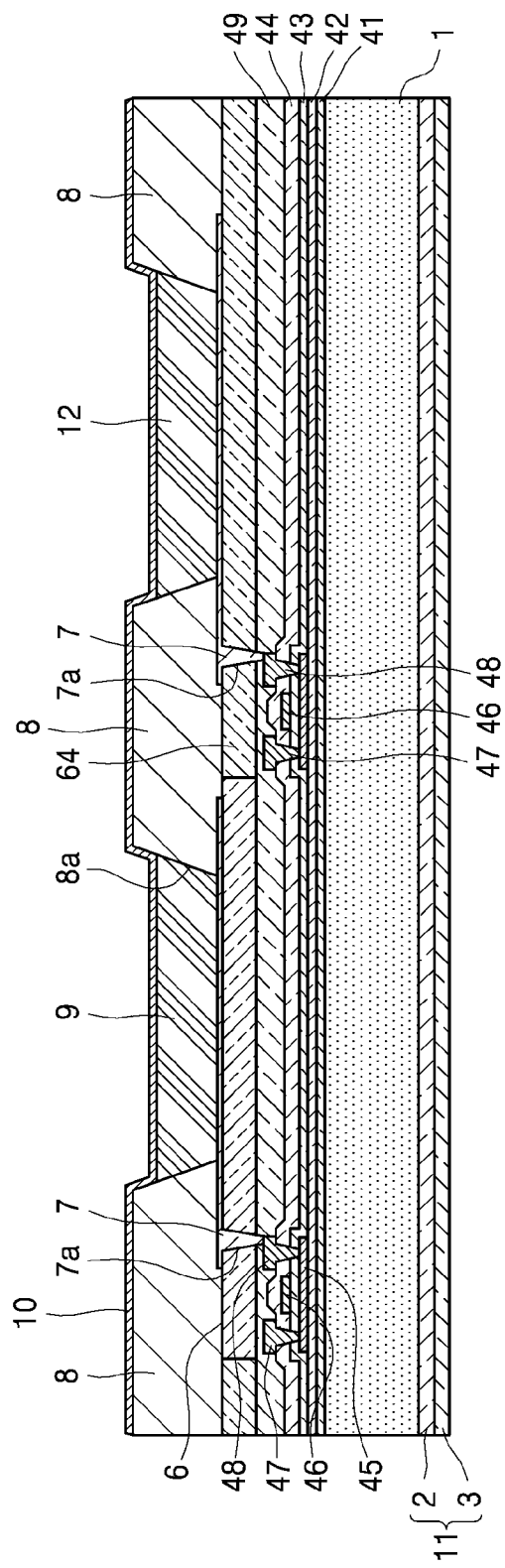
FIG. 26 is a cross-sectional view of an element of another embodiment of an organic EL display device according to the invention.

FIG. 26 is a cross-sectional view of an element of another embodiment of an organic EL display device according to the invention. FIG. 26 shows a portion for emitting light of any one primary color (e.g., red, green or blue) and a portion for emitting light of a white color in a plurality of colors constituting one pixel in an embodiment of the organic EL display device. In such an embodiment, as in the embodiment shown in FIG. 25, one pixel includes four emission layers for emitting light of three primary colors (for example, red, green, and blue) and a white color, and thus color reproducibility of the white color is substantially improved.

Referring to FIG. 26, in an embodiment, the portions for emitting light of primary colors have substantially the same configuration as the portions for emitting light of primary colors in the embodiment shown in FIG. 7. In an embodiment, as shown in FIG. 26, the portions for emitting light of primary colors are provided with an isotropic liquid crystal layer (not having a selective reflection function) 64, instead of the reflection layer 60 including the three selectively-reflecting layers 61, 62 and 63. In such an embodiment, a isotropic liquid crystal layer 64 may be provided, e.g., formed, by being exposed to a high temperature before exposing the liquid crystal composition, which is a material of the selectively-reflecting layer 6.

In such an embodiment, the operations in the portions for emitting light of primary colors are substantially the same as the operations in the embodiment shown in FIG. 1. In such an embodiment, the operations regarding the reflection of the external light in the electrodes 46 to 48 of the TFT and in the wiring line in the portion for emitting white light are substantially the same as the operations regarding the reflection of the external light in the electrodes 46 to 48 of the TFT and in the wiring line in the embodiment shown in FIG. 1.

In an embodiment, as shown in FIG. 26, all components of the white light generated from the white emission layer 12 pass through the isotropic liquid crystal layer 64. However, since the components are unpolarized, about one half of the components pass through the circularly-polarizing plate 11, and about the other half of the components are absorbed by the circularly-polarizing plate 11. However, in such an embodiment, since the white emission layer 12 does not originally have a wavelength selection function, the white emission layer 12 has high energy efficiency. In such an embodiment, since light emitted through excitation may not reduce an amount of light by the color filter 13, the brightness of a display in the portion for emitting white light is higher than the brightness of a display in the portions emitting light of primary colors.

In such an embodiment, the external light that passes through the circularly-polarizing plate 11 and enters the organic EL display device is constituted by only a circularly polarized component rotating in a predetermined direction (e.g., the left spiral direction as shown in FIG. 2). The external light passes through the isotropic liquid crystal layer 64 and the white emission layer 12, and is then reflected by the reflective electrode 10, and thus the rotation direction thereof is reversed. Accordingly, even though the reflected light passes again through the white emission layer 12 and the isotropic liquid crystal layer 64 and reaches the circularly-polarizing plate 11, the reflected light is blocked by the circularly-polarizing plate 11. Therefore, in such an embodiment, the contrast is effectively prevented from being deteriorated. In such an embodiment, the portions for emitting light of primary colors have substantially the same configuration as the portions for emitting light of primary colors in the embodiments shown in FIGS. 8, 9, and 22 to 24.

Figure 27:
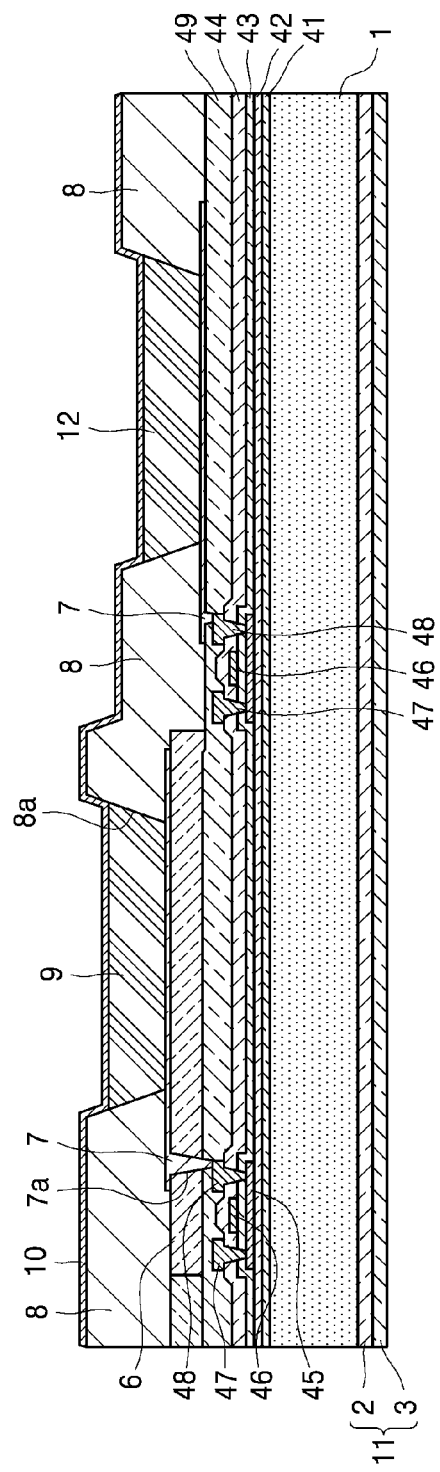
FIG. 27 is a cross-sectional view of an element of another embodiment of an organic EL display device according to the invention.

FIG. 27 is a cross-sectional view of an element of another embodiment of an organic EL display device according to the invention. FIG. 27 shows a portion for emitting light of any one primary color (for example, red, green, or blue) and a portion for emitting light of a white color in a plurality of colors constituting one pixel in an embodiment of the organic EL display device. In such an embodiment, as in the embodiment shown in FIG. 25, the embodiment of the organic EL display device shown in FIG. 27 includes a pixel including four emission layers for emitting light of three primary colors (for example, red, green, and blue) and a white color, and thus color reproducibility of the white color thereof is substantially improved.

Referring to FIG. 27, in such an embodiment, the portions for emitting light of primary colors have substantially the same configuration as the portions for emitting light of primary colors in the embodiment shown in FIG. 9. In such an embodiment, however, the portion for emitting a white light is not provided with a liquid crystal layer between the TFT layer 4 and the transparent electrode 7. In such an embodiment, as in the embodiment shown in FIG. 9, each selectively-reflecting layer 6 is formed by development for each wavelength band, and thus the selectively-reflecting layer 6 is not provided in the portion emitting white light. In such an embodiment, the operations in the portions emitting light of primary colors are the same as the operations in the portions emitting light of primary colors in the embodiment shown in FIG. 1. In such an embodiment, the operations in the portion for emitting white light are substantially the same as the operations in the portion for emitting white light in the embodiment shown in FIG. 26.

According to embodiments of the organic EL display device, as described above, all components of light generated from an emission layer pass through a selectively-reflecting layer in a state where the components are converted into circularly polarized light in the same rotation direction as circularly polarized light passing through a circularly-polarizing plate, and then pass through a TFT layer, a transparent substrate and the circularly-polarizing plate, and are emitted to the outside. Thus, in such embodiments, the brightness of a display is effectively prevented from being decreased. In such embodiments, external light entering the organic EL display device is blocked by the circularly-polarizing plate to be effectively prevented from being emitted to the outside, and thus the contrast under the external light is substantially improved.

It should be understood that the embodiments described therein should be considered in a descriptive sense only and not for purposes of limitation. Descriptions of features or aspects within each embodiment should typically be considered as available for other similar features or aspects in other embodiments.

What is claimed is:

1. An organic electroluminescence display device comprising:
    a transparent substrate;
    a circularly-polarizing plate disposed on a first surface of the transparent substrate;
    a wiring layer disposed on a second surface of the transparent substrate;
    a selectively-reflecting layer disposed on the wiring layer, wherein
        the selectively-reflecting layer reflects only a circularly polarized component which has a predetermined wavelength and rotates in a predetermined direction, in incident light, and
        the selectively-reflecting layer transmits light of a wavelength different from the predetermined wavelength in the incident light and a circularly polarized component, which has the predetermined wavelength and rotates in a direction different from the predetermined direction, in the incident light;
    a transparent electrode disposed on the selectively-reflecting layer;
    an emission layer disposed on the transparent electrode in a position corresponding to the selectively-reflecting layer, wherein the emission layer emits light of a predetermined color; and
    a reflective electrode disposed on the emission layer, wherein the wiring layer comprises:
    a protection layer;
    a first insulating layer;
    a second insulating layer;
    a third insulating layer, wherein the protection layer, the first insulating layer, the second insulating layer and the third insulating layer are sequentially stacked on the second surface of the transparent substrate;
    a semiconductor layer disposed between the first insulating layer and the second insulating layer;
    a gate electrode disposed between the second insulating layer and the third insulating layer;
    a source electrode; and
    a drain electrode.

2. The organic electroluminescence display device of claim 1, wherein
    the circularly-polarizing plate transmits the circularly polarized component which passes through the selectively-reflecting layer and rotates in the direction different from the predetermined direction.

3. The organic electroluminescence display device of claim 2, wherein
    the circularly-polarizing plate comprises:
    a ¼ wave plate disposed on the first surface of the transparent substrate; and
    a polarizing plate disposed on the ¼ wave plate.

4. The organic electroluminescence display device of claim 1, wherein
    the selectively-reflecting layer comprises a cholesteric liquid crystal.

5. The organic electroluminescence display device of claim 1, wherein
    the transparent electrode is disposed in a position corresponding to the emission layer, and
    the reflective electrode is a common electrode.

6. The organic electroluminescence display device of claim 1, wherein
    a contact hole is defined in the selectively-reflecting layer, and
    the transparent electrode and the drain electrode are connected to each other via the contact hole.

7. The organic electroluminescence display device of claim 6, further comprising:
    a passivation layer disposed on a surface of the selectively-reflecting layer and on an inner surface of the contact hole.

8. The organic electroluminescence display device of claim 1, wherein
    the wiring layer further comprises a planarization layer disposed on the third insulating layer.

9. The organic electroluminescence display device of claim 1, further comprising:
    an alignment layer disposed between the wiring layer and the selectively-reflecting layer.

10. The organic electroluminescence display device of claim 1, wherein
    the emission layer emits light of red, green or blue colors.

11. The organic electroluminescence display device of claim 1, wherein
    the emission layer emits white light.

12. The organic electroluminescence display device of claim 11, further comprising:
    a color filter of a predetermined color disposed between the selectively-reflecting layer and the transparent electrode.

13. The organic electroluminescence display device of claim 11, further comprising:
    a color filter of a predetermined color disposed between the transparent substrate and the selectively-reflecting layer.

* * * * *